United States Patent
Maeda et al.

(10) Patent No.: US 9,842,732 B2
(45) Date of Patent: *Dec. 12, 2017

(54) SUBSTRATE CLEANING APPARATUS AND SUBSTRATE CLEANING METHOD

(71) Applicant: EBARA CORPORATION, Tokyo (JP)

(72) Inventors: Koji Maeda, Tokyo (JP); Soichi Isobe, Tokyo (JP); Hiroshi Shimomoto, Tokyo (JP); Hideaki Tanaka, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/616,582

(22) Filed: Jun. 7, 2017

(65) Prior Publication Data

US 2017/0271178 A1    Sep. 21, 2017

Related U.S. Application Data

(62) Division of application No. 14/061,686, filed on Oct. 23, 2013, now Pat. No. 9,704,728.

(30) Foreign Application Priority Data

Oct. 25, 2012  (JP) .................... 2012-235403
Oct. 15, 2013  (JP) .................... 2013-214958

(51) Int. Cl.
*B06B 1/00*     (2006.01)
*H01L 21/02*    (2006.01)
*H01L 21/67*    (2006.01)

(52) U.S. Cl.
CPC .. *H01L 21/02057* (2013.01); *H01L 21/67046* (2013.01)

(58) Field of Classification Search
None
See application file for complete search history.

(56) References Cited

U.S. PATENT DOCUMENTS

| 5,829,087 A | 11/1998 | Nishimura et al. |
| 6,446,296 B1 | 9/2002 | Middendorf et al. |
| 2002/0007840 A1 | 1/2002 | Atoh |

FOREIGN PATENT DOCUMENTS

| CN | 1312953 A | 9/2001 |
| JP | H09-326378 A | 12/1997 |

(Continued)

OTHER PUBLICATIONS

Machine translation of JP2008-130820 by Takahashi, dated Jun. 5, 2008.

*Primary Examiner* — Mikhail Kornakov
*Assistant Examiner* — Ryan L Coleman
(74) *Attorney, Agent, or Firm* — Baker & Hostetler LLP

(57) ABSTRACT

A substrate cleaning apparatus performs scrub cleaning of a surface of a substrate with an elongated cylindrical roll cleaning member. The substrate cleaning apparatus includes a roll holder for supporting the cleaning member and rotate the roll cleaning member, a vertical movement mechanism for vertically moving the roll holder so that the roll cleaning member applies a roll load to the substrate at the time of cleaning the substrate by actuation of an actuator having a regulating device, a load cell for measuring the roll load, and a controller for performing feedback control of the roll load through the regulating device based on the measured value of the load cell. The substrate cleaning apparatus further includes a monitor unit for monitoring whether an operation amount of the regulating device falls outside an allowable range of a preset reference value of an operation amount corresponding to a preset roll load.

6 Claims, 5 Drawing Sheets

(56) References Cited

FOREIGN PATENT DOCUMENTS

| | | |
|---|---|---|
| JP | H10-199666 A | 7/1998 |
| JP | 2000-021838 A | 1/2000 |
| JP | 2002-050602 A | 2/2002 |
| JP | 2006-332534 A | 12/2006 |
| JP | 2008-130820 A | 6/2008 |
| WO | WO 2000/03419 A3 | 1/2000 |

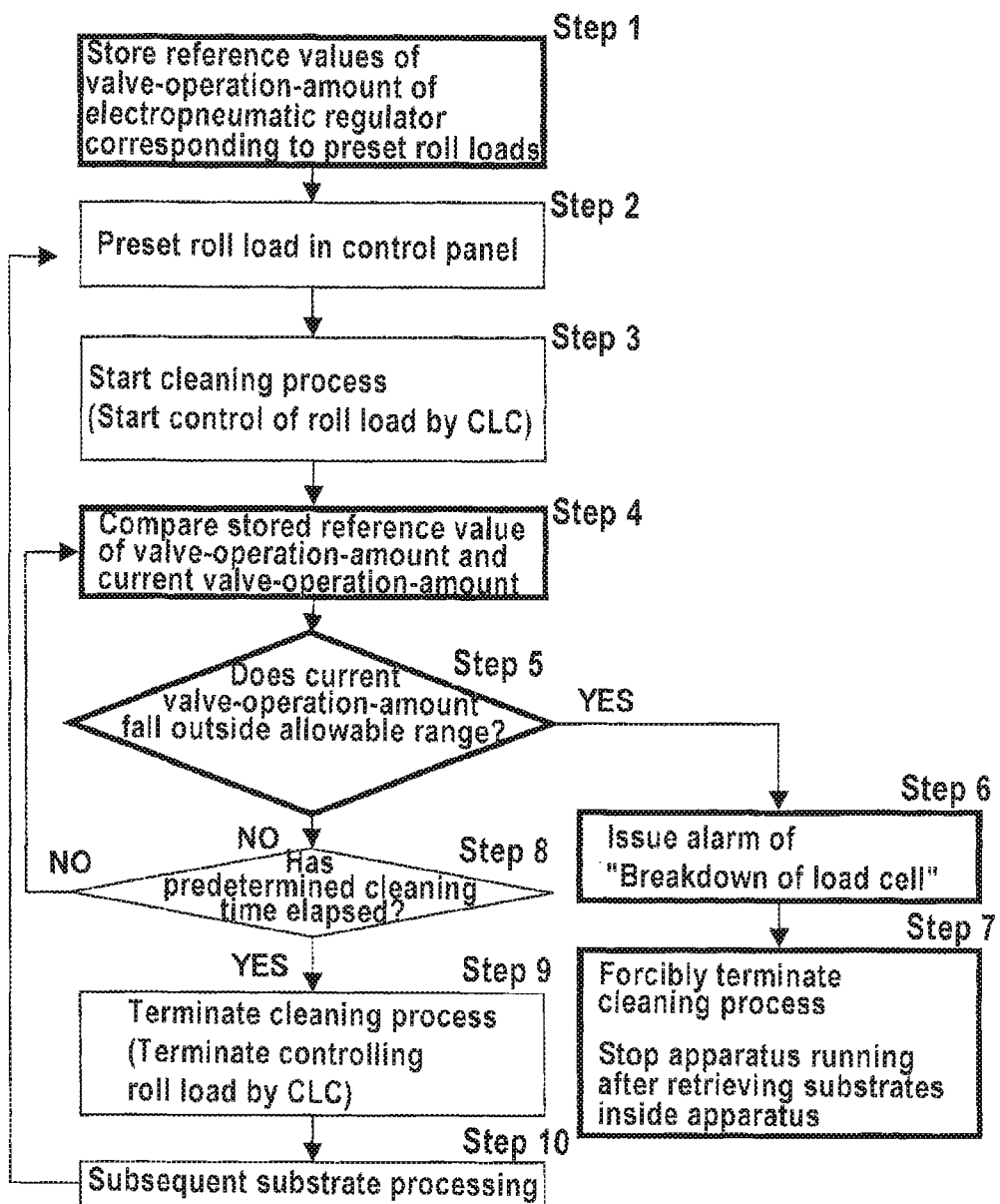

SUBSTRATE CLEANING APPARATUS AND SUBSTRATE CLEANING METHOD

CROSS REFERENCE TO RELATED APPLICATIONS

This application is a divisional of U.S. patent application Ser. No. 14/061,686 filed Oct. 23, 2013; the entire contents are incorporated herein by reference.

BACKGROUND OF THE INVENTION

Field of the Invention

The present invention relates to a substrate cleaning apparatus and a substrate cleaning method for performing scrub cleaning of a surface of a substrate, such as a semiconductor wafer, with an elongated cylindrical roll cleaning member extending horizontally, by rotating the substrate and the roll cleaning member each in one direction while keeping the roll cleaning member in contact with the surface of the substrate.

Description of the Related Art

In a cleaning apparatus for performing scrub cleaning of a surface of a substrate, such as a semiconductor wafer, with a roll cleaning member, the roll cleaning member is rotated and pressed against the substrate under a predetermined pressing load (roll load) during cleaning of the substrate. Controlling and adjusting the roll load to an appropriate value is important to increase the cleanliness of the substrate or to prevent the substrate from being damaged.

Therefore, the applicant of the present invention has proposed a substrate cleaning apparatus having a closed-loop feedback control (CLC) system in which the pressing load (roll load) for pressing the roll cleaning member against the substrate is measured by a load cell during cleaning of the substrate to control a regulating device of an actuator, such as a motor, based on the measured values, thereby controlling the roll load to an appropriate value by feedback control, as disclosed in Japanese laid-open patent publication No. 2002-50602.

In the case where the pressing load (roll load) for pressing the roll cleaning member against the substrate is measured by the load cell to control the roll load based on the measured values by feedback control during cleaning of the substrate, if the roll load is not measured accurately due to breakdown of the load cell, an appropriate roll load cannot be applied to the substrate by the roll cleaning member.

Specifically, if the measured value (measured roll load) of the load cell becomes larger than the actual roll load due to breakdown of the load cell, a roll load which is smaller than the predetermined roll load is applied to the substrate by the roll cleaning member, thus reducing the cleaning ability for the substrate. On the other hand, if the measured value (measured roll load) of the load cell becomes smaller than the actual roll load, a roll load which is larger than the predetermined roll load is applied to the substrate by the roll cleaning member, thus possibly causing breakage of the substrate.

SUMMARY OF THE INVENTION

Based on the above knowledge obtained from various experiments, the present invention has been made. It is therefore an object of the present invention to provide a substrate cleaning apparatus and a substrate cleaning method which can rapidly detect breakdown of a load cell for measuring a roll load during cleaning of a substrate, to prevent the cleaning of the substrate, in a state in which an abnormal roll load is applied to the substrate by a roll cleaning member, from being continued.

In order to achieve the above object, according to an aspect of the present invention, there is provided a substrate cleaning apparatus for cleaning a substrate, comprising: a roll holder configured to support a horizontally elongated roll cleaning member and rotate the roll cleaning member; a vertical movement mechanism configured to vertically move the roll holder so that the roll cleaning member applies a roll load to the substrate at the time of cleaning the substrate by actuation of an actuator having a regulating device; a load cell configured to measure the roll load; a controller configured to perform feedback control of the roll load through the regulating device based on the measured value of the load cell; and a monitor unit configured to monitor whether an operation amount of the regulating device falls outside an allowable range of a preset reference value of an operation amount corresponding to a preset roll load.

If the load cell for measuring the roll load breaks down to cause an error in the measured value of the load cell, the operation amount of the regulating device is deviated from the preset reference value of the operation amount corresponding to the preset roll load. Therefore, the monitor unit monitors whether the operation amount of the regulating device falls outside the allowable range of the preset reference value of the operation amount corresponding to the preset roll load, thereby detecting breakdown of the load cell promptly during cleaning of the substrate.

In a preferred aspect of the present invention, the substrate cleaning apparatus further comprises an alarm configured to issue an alarm when the operation amount of the regulating device falls outside the allowable range of the preset reference value of the operation amount corresponding to the preset roll load.

In a preferred aspect of the present invention, the actuator comprises an air cylinder, and the regulating device comprises an electropneumatic regulator configured to control a valve opening degree of a regulating valve for regulating a pressure of air to be supplied to the air cylinder.

According to another aspect of the present invention, there is provided a substrate cleaning method for cleaning a substrate, comprising: applying a roll load to the substrate by a horizontally elongated roll cleaning member configured to be moved vertically by actuation of an actuator having a regulating device; measuring the roll load applied to the substrate by a load cell; and monitoring whether an operation amount of the regulating device falls outside an allowable range of a preset reference value of an operation amount corresponding to a preset roll load while performing feedback control of the roll load through the regulating device based on the measured value of the load cell.

In a preferred aspect of the present invention, the substrate cleaning method further comprises issuing an alarm when the operation amount of the regulating device falls outside the allowable range of the preset reference value of the operation amount corresponding to the preset roll load.

According to the present invention, the monitor unit monitors whether the operation amount of the regulating device falls outside the allowable range of the preset reference value of the operation amount corresponding to the preset roll load, thereby detecting breakdown of the load cell promptly during cleaning of the substrate. In this manner, the cleaning of the substrate in a state in which an abnormal roll load is applied to the substrate by the roll cleaning member can be prevented from being continued.

BRIEF DESCRIPTION OF THE DRAWINGS

FIG. 6 is a flow chart showing an embodiment of control for cleaning the front surface (upper surface) of the substrate while performing feedback control of a roll load applied to the substrate by an upper roll cleaning member of the substrate cleaning apparatus shown in FIG. 3.

DETAILED DESCRIPTION

A substrate cleaning apparatus and a substrate cleaning method according to embodiments of the present invention will be described below with reference to FIGS. 1 through 6.

Figure 1:
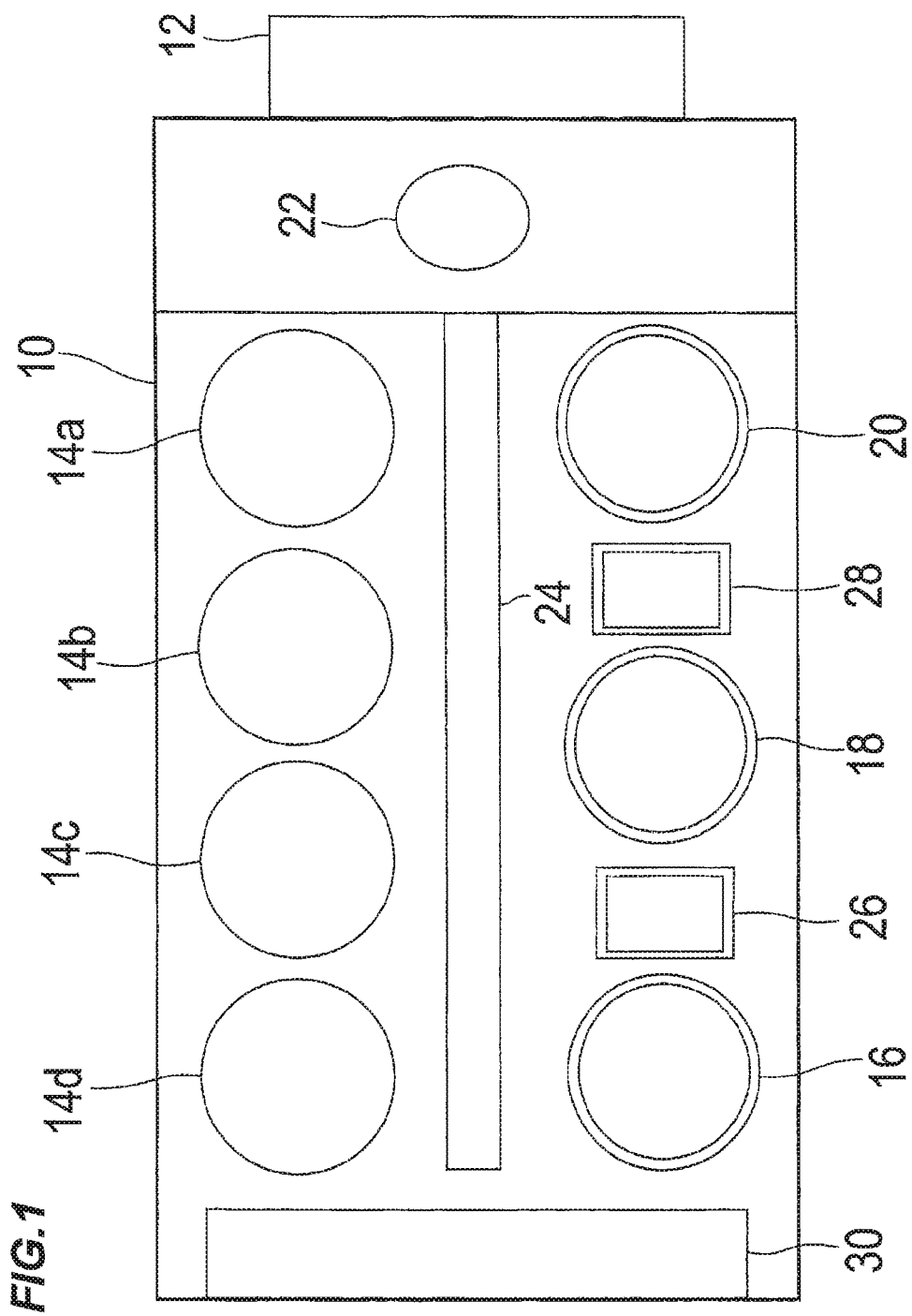
FIG. 1 is a plan view showing an entire structure of a substrate processing apparatus incorporating a substrate cleaning apparatus according to an embodiment of the present invention.

FIG. 1 is a plan view showing an entire structure of a substrate processing apparatus incorporating a substrate cleaning apparatus according to an embodiment of the present invention. As shown in FIG. 1, the substrate processing apparatus includes a generally-rectangular housing 10, and a loading port 12 for placing thereon a substrate cassette storing a large number of substrates, such as semiconductor wafers. The loading port 12 is disposed adjacent to the housing 10 and is capable of placing thereon an open cassette, a SMIF (standard manufacturing interface) pod or a FOUP (front opening unified pod). Each of the SMIF and the FOUP is a hermetically sealed container which houses therein a substrate cassette and is covered with a partition wall, and thus can keep independent internal environment isolated from an external space.

In the housing 10, there are provided a plurality of (four in this embodiment) polishing units 14a, 14b, 14c, 14d, a first substrate cleaning unit 16 and a second substrate cleaning unit 18 each for cleaning a substrate after polishing, and a substrate drying unit 20 for drying a substrate after cleaning. The polishing units 14a, 14b, 14c, 14d are arranged in the longitudinal direction of the substrate processing apparatus, and the substrate cleaning units 16, 18 and the substrate drying unit 20 are also arranged in the longitudinal direction of the substrate processing apparatus. The substrate cleaning apparatus according to the embodiment of the present invention is applied to the first substrate cleaning unit 16.

A first substrate transfer robot 22 is disposed in an area surrounded by the loading port 12, and the polishing unit 14a and the substrate drying unit 20 which are located near the loading port 12. Further, a substrate transport unit 24 is disposed in parallel to the polishing units 14a, 14b, 14c, 14d.

The first substrate transfer robot 22 receives a substrate before polishing from the loading port 12 and transfers the substrate to the substrate transport unit 24, and receives a substrate after drying from the substrate drying unit 20 and returns the substrate to the loading port 12. The substrate transport unit 24 transports a substrate transferred from the first substrate transfer robot 22, and transfers the substrate between the substrate transport unit 24 and the polishing units 14a, 14b, 14c, 14d.

Between the first substrate cleaning unit 16 and the second substrate cleaning unit 18, there is provided a second substrate transfer robot 26 for transferring a substrate between the first substrate cleaning unit 16 and the second substrate cleaning unit 18. Between the second substrate cleaning unit 18 and the substrate drying unit 20, there is provided a third substrate transfer robot 28 for transferring a substrate between the second substrate cleaning unit 18 and the substrate drying unit 20. In the housing 10, there is provided a control panel (operation panel) 30 for setting a controller 66, inputting a preset value of the roll load (instructing a preset roll load), and the like, described below.

Figure 2:
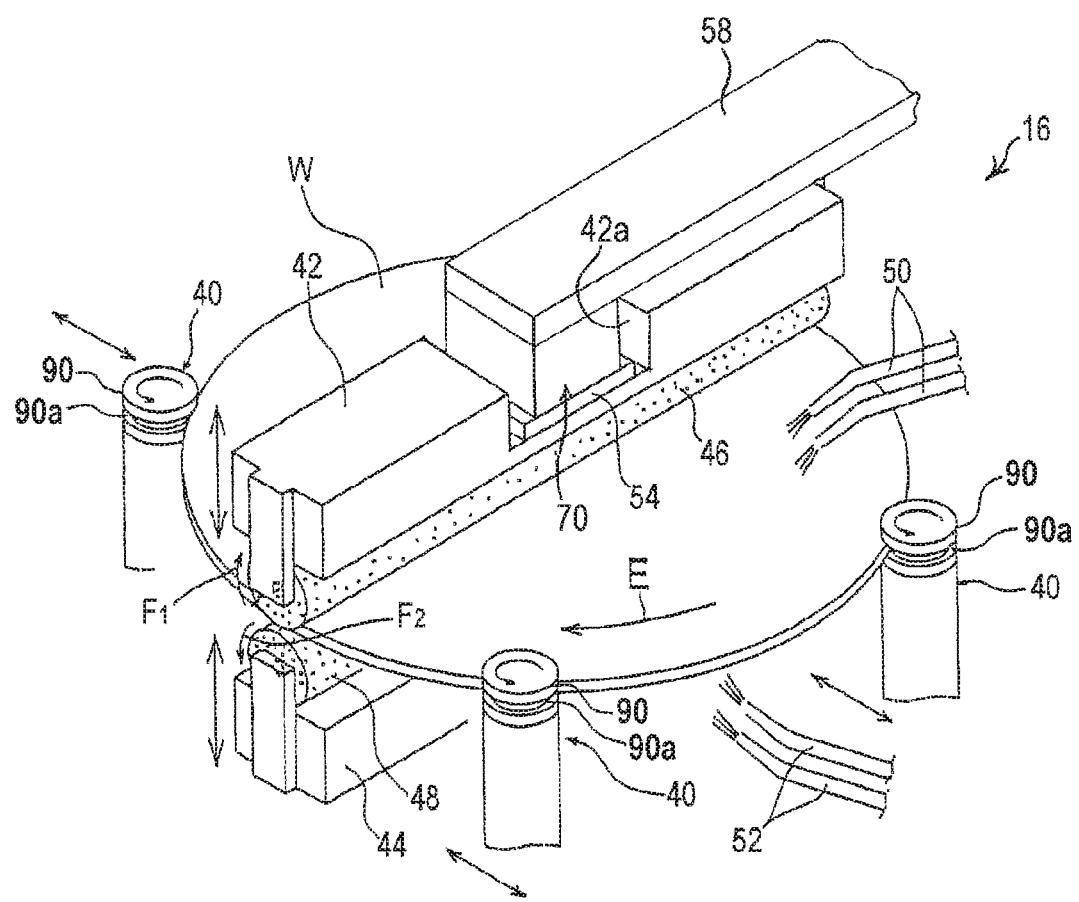
FIG. 2 is a schematic perspective view showing the substrate cleaning apparatus, according to an embodiment of the present invention, which is incorporated in the substrate processing apparatus shown in FIG. 1.
Figure 3:
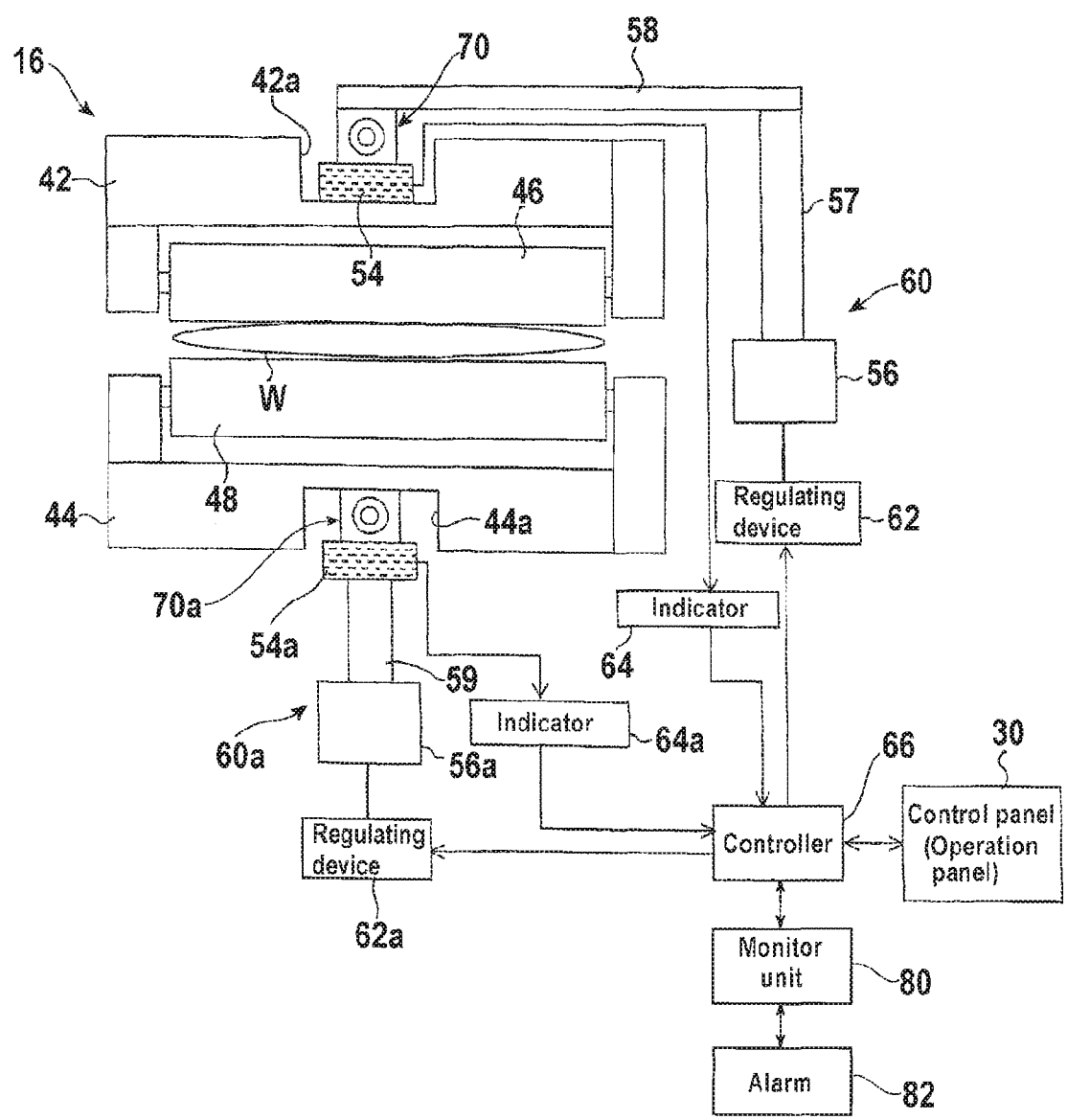
FIG. 3 is a schematic elevational view showing an entire structure of the substrate cleaning apparatus according to the embodiment of the present invention.

FIG. 2 is a schematic perspective view showing the substrate cleaning apparatus (first substrate cleaning unit 16), according to an embodiment of the present invention, incorporated in the substrate processing apparatus shown in FIG. 1. FIG. 3 is a schematic elevational view showing an entire structure of the substrate cleaning apparatus 16 according to the embodiment of the present invention.

As shown in FIGS. 2 and 3, the substrate cleaning unit 16 includes a plurality of (four as illustrated) horizontally movable spindles 40 for supporting a periphery of a substrate W, such as a semiconductor wafer, with its front surface facing upwardly, and horizontally rotating the substrate W, a vertically movable upper roll holder 42 disposed above the substrate W rotatably supported by the spindles 40, and a vertically movable lower roll holder 44 disposed below the substrate W rotatably supported by the spindles 40.

An elongated cylindrical upper roll cleaning member (roll sponge) 46 made of PVA or the like, is rotatably supported by the upper roll holder 42. The upper roll cleaning member 46 is rotated by a driving mechanism (not shown) in the direction shown by the arrow $F_1$ in FIG. 2. An elongated cylindrical lower roll cleaning member (roll sponge) 48, made of PVA or the like, is rotatably supported by the lower roll holder 44. The lower roll cleaning member 48 is rotated by a driving mechanism (not shown) in the direction shown by the arrow $F_2$ in FIG. 2.

An upper cleaning liquid supply nozzle 50 for supplying a cleaning liquid onto the front surface (upper surface) of the substrate W is disposed above the substrate W rotatably supported by the spindles 40. A lower cleaning liquid supply nozzle 52 for supplying a cleaning liquid onto the back surface (lower surface) of the substrate W is disposed below the substrate W rotatably supported by the spindles 40.

A concave portion 42a is provided at a substantially central area along the longitudinal direction of the upper roll holder 42, and a load cell 54 is located inside of the concave portion 42a and is fixed to the upper roll holder 42. In this example, there is provided a vertical movement mechanism 60 comprising an air cylinder 56 disposed in the vertical direction to serve as an actuator, a vertically movable shaft 57 vertically movable by actuation of the air cylinder (actuator) 56, and a vertically movable arm 58, as a vertically movable unit, extending in the horizontal direction and having a base end connected to the upper end of the vertically movable shaft 57. The upper roll holder 42 is coupled via the load cell 54 to a lower end of a free end side of the vertically movable arm (vertically movable unit) 58. A tilting mechanism 70 for tilting the upper roll holder 42 is disposed between the load cell 54 and the lower surface of the free end side of the vertically movable arm 58.

With this configuration, the upper roll holder 42 is vertically moved together with the vertically movable shaft 57 and the vertically movable arm 58, by actuation of the air cylinder 56. The air cylinder 56 is provided with an electropneumatic regulator 62, as a regulating device, for regulating a pressure of air to be supplied to an interior of the air cylinder 56. By adjusting a valve opening degree of the electropneumatic regulator (regulating device) 62, the pressure of air to be supplied into the air cylinder 56 is regulated.

In this manner, the upper roll holder 42 is coupled to the lower surface of the free end side of the vertically movable arm 58 at the substantially central area along the longitudinal direction of the upper roll holder 42 so that a vertical line, passing through the center of gravity of the upper roll holder 42 which supports and rotates the upper roll cleaning member 46, passes through the center of the load cell 54 or a location close to the center of the load cell 54, thereby coupling the upper roll holder 42 to the lower surface of the free end side of the vertically movable arm 58 in a horizontal state and a well-balanced manner.

Further, the own weight of the upper roll holder 42 can be transmitted to the load cell 54 without any loss by coupling the upper roll holder 42 to the lower surface of the free end side of the vertically movable arm 58 via the load cell 54. When the upper roll holder 42 is lowered to bring the upper roll cleaning member 46 into contact with the substrate W at the time of cleaning the substrate W, a tensile load applied to the load cell 54 is reduced by a certain amount which substantially coincides with the roll load (pressing load) applied to the substrate W by the upper roll cleaning member 46.

Accordingly, the roll load applied to the substrate W by the upper roll cleaning member 46 during cleaning of the substrate W is measured by the load cell 54 based on the reduced tensile load and the valve opening degree is adjusted by an operation amount of the electropneumatic regulator 62, thereby regulating the roll load.

The measured value measured by the load cell 54 is outputted to an indicator 64, and an analog signal is sent from the indicator 64 to the controller 66 as a control unit. Then, the analog signal sent from the controller (control unit) 66 is inputted to the electropneumatic regulator 62. Thus, a closed-loop control system for performing a closed-loop control is constructed. Further, a preset value of the roll load (preset roll load) and the like are inputted from the control panel (operation panel) 30 to the controller 66.

With this configuration, the controller 66 compares the measured value (measured roll load) measured by the load cell 54 and the preset roll load inputted from the control panel (operation panel) 30 and gives the electropneumatic regulator 62 an instruction of an operation amount of a regulating valve (valve-operation-amount) for the air cylinder, depending on a difference between the measured roll load and the preset roll load. The electropneumatic regulator 62 automatically adjusts the valve opening degree of the regulating valve in response to the instruction from the controller 66 to vary a thrust force of the air cylinder 56 with the adjusted valve opening degree, thereby performing feedback control of the roll load applied to the substrate W during cleaning of the substrate W.

According to this example, the load cell 54 is provided between the vertically movable arm 58 of the vertical movement mechanism 60 and the upper roll holder 42 coupled to the vertically movable arm 58, and the load cell 54 is configured to receive the own weight of the upper roll holder 42. Further, a bearing or a link rod which increases friction during vertical movement of the upper roll holder 42, or a beam structure or projection which causes a loss in load transmission, is not provided between the upper roll holder 42 and the load cell 54. Thus, the roll load applied to the substrate W during cleaning of the substrate is transmitted to the load cell 54 accurately, thereby measuring the roll load with high accuracy and controlling the roll load.

If the load cell 54 breaks down during cleaning of the substrate W while measuring the roll load by the load cell 54, the accurate roll load cannot be measured, and thus an appropriate roll load cannot be applied to the substrate W by the upper roll cleaning member 46. Accordingly, the breakdown of the load cell 54 causes an error in the measured value (measured roll load) of the load cell 54, and thus a current valve-operation-amount of the electropneumatic regulator 62, i.e. a valve-operation-amount outputted from the controller 66 to the electropneumatic regulator 62, is deviated from a preset reference value of the valve-operation-amount depending on the preset roll load.

Thus, in this example, a monitor unit 80 connected to the controller 66 monitors whether the valve-operation-amount outputted to the electropneumatic regulator 62 falls outside an allowable range of the preset reference value of the valve-operation-amount depending on the preset roll load, thereby detecting breakdown of the load cell 54 promptly during cleaning of the substrate W.

Specifically, the reference value of the valve-operation-amount for each of the preset roll loads inputted from the control panel 30 to the controller 66, is inputted in advance and stored in the monitor unit 80, and the valve-operation-amount outputted from the controller 66 to the electropneumatic regulator 62 is inputted to the monitor unit 80. Then, the monitor unit 80 monitors whether the valve-operation-amount outputted to the electropneumatic regulator 62 falls outside the allowable range of the reference value of the valve-operation-amount corresponding to the preset roll load inputted from the control panel 30 to the controller 66. When the monitor unit 80 detects breakdown of the load cell 54, the monitor unit 80 outputs a signal to an alarm 82 connected to the monitor unit 80, and then the alarm 82 issues an alarm in response to the signal.

Figure 4:
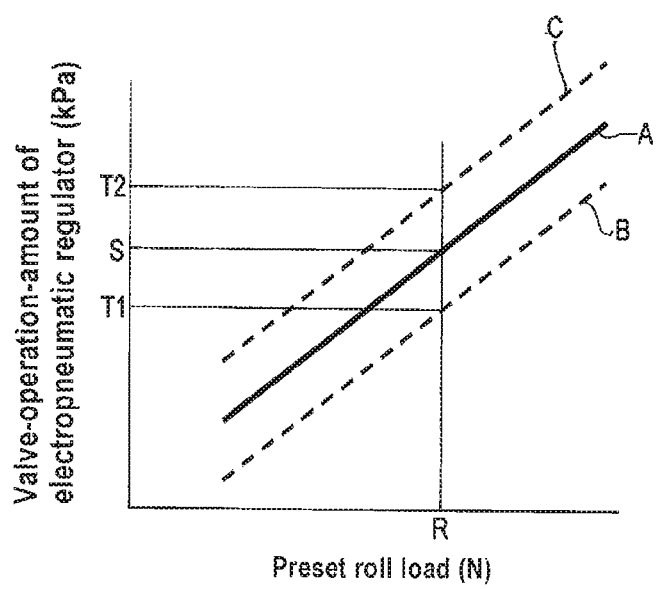
FIG. 4 is a graph showing an example of the relationship between a preset roll load (N), a reference value of a valve-operation-amount (kPa) of an electropneumatic regulator, and an allowable range of the reference value.

FIG. 4 shows an example of the relationship between the preset roll load (N), the reference value of the valve-operation-amount (kPa) of the electropneumatic regulator, and the allowable range of the reference value. In this example, the reference values of the valve-operation-amount (kPa), of the electropneumatic regulator, corresponding to the respective preset roll loads (N) are shown by a linearly-extending line A. A linearly extending line B obtained by subtracting a constant value from the line A shows lower thresholds, and a linearly extending line C obtained by adding a constant value to the line A shows upper thresholds. A range between the line B (lower thresholds) and the line C (upper thresholds) is determined as an allowable range.

Specifically, in the case where the preset roll load instructed from the control panel 30 to the controller 66 is R (N), the reference value of the valve-operation-amount of the electropneumatic regulator 62 corresponding to the preset roll load is S (kPa) which is an intersection of the preset roll load R with the line A, and the allowable range of the reference value S of the valve-operation-amount is the range (T1 to T2) between the lower threshold T1 (kPa) which is an intersection of the preset roll load R with the line B and the upper threshold T2 (kPa) which is an intersection of the preset roll load R with the line C.

Each of the preset roll loads (N) and each of the reference values of the valve-operation-amount (kPa) of the electropneumatic regulator may be one-to-one correspondence.

When the substrate W is actually being cleaned while controlling the roll load applied to the substrate W by the upper roll cleaning member 46 to the preset roll load R, the monitor unit 80 judges that the load cell 54 operates normally if the valve-operation-amount (kPa) outputted from the controller 66 to the electropneumatic regulator 62 falls within the allowable range (T1 to T2), and judges that the load cell 54 breaks down if the valve-operation-amount falls outside the allowable range (T1 to T2), i.e. the valve-operation-amount becomes smaller than the lower threshold T1 or larger than the upper threshold T2.

Figure 5:
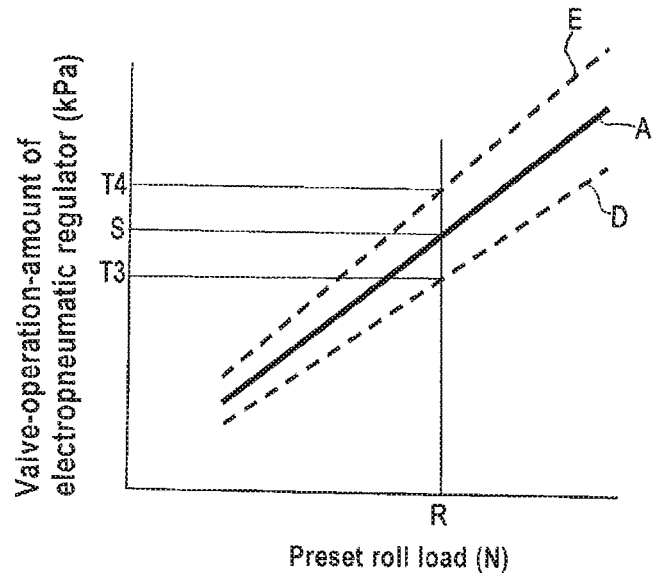
FIG. 5 is a graph showing another example of the relationship between the preset roll load (N), the reference value of the valve-operation-amount (kPa) of the electropneumatic regulator, and the allowable range of the reference value.

FIG. 5 shows another example of the relationship between the preset roll load (N), the reference value of the valve-operation-amount (kPa) of the electropneumatic regulator, and the allowable range of the reference value. In this example, the reference values of the valve-operation-amount (kPa), of the electropneumatic regulator, corresponding to the respective preset roll loads (N) are shown by a linearly-extending line A. A linearly extending line D obtained by subtracting a constant percentage (%) from the line A shows lower thresholds, and a linearly extending line E obtained by adding a constant percentage (%) to the line A shows upper thresholds. A range between the line D (lower threshold) and the line E (upper threshold) is determined as an allowable range.

Specifically, in the case where the preset roll load instructed from the control panel 30 to the controller 66 is R (N), the reference value of the valve-operation-amount of the electropneumatic regulator 62 corresponding to the preset roll load is S (kPa) which is an intersection of the preset roll load R with the line A, and the allowable range of the reference value S of the valve-operation-amount is the range (T3 to T4) between the lower threshold T3 (kPa) which is an intersection of the preset roll load R with the line D and the upper threshold T4 (kPa) which is an intersection of the preset roll load R with the line E.

As shown in FIG. 3, a concave portion 44a is provided at a substantially central area along the longitudinal direction of the lower roll holder 44. The lower roll holder 44 has a vertical movement mechanism 60a comprising an air cylinder 56a disposed in the vertical direction to serve as an actuator, and a vertically movable shaft 59 as a vertically movable unit vertically movable by actuation of the air cylinder (actuator) 56a. The lower roll holder 44 is coupled via a load cell 54a to an upper end surface of the vertically movable shaft (vertically movable unit) 59. With this configuration, the lower roll holder 44 is vertically moved together with the vertically movable shaft 59 by actuation of the air cylinder 56a. The air cylinder 56a is provided with an electropneumatic regulator 62a serving as a regulating device, in the same manner as the above. A tilting mechanism 70a for tilting the lower roll holder 44 is disposed between the load cell 54a fixed to the upper end surface of the vertically movable shaft 59 and the lower roll holder 44.

In this manner, the lower roll holder 44 is coupled to the upper end surface of the vertically movable shaft 59 at the substantially central area along the longitudinal direction of the lower roll holder 44 so that a vertical line, passing through the center of gravity of the lower roll holder 44 which supports and rotates the lower roll cleaning member 48, passes through the center of the load cell 54a or a location closed to the center of the load cell 54a, thereby coupling the lower roll holder 44 to the vertically movable shaft 59 in a horizontal state and a well-balanced manner.

Further, the own weight of the lower roll holder 44 can be transmitted to the load cell 54a without any loss by coupling the lower roll holder 44 to the upper end surface of the vertically movable shaft 59 via the load cell 54a. When the lower roll holder 44 is lifted to bring the lower roll cleaning member 48 into contact with the substrate W, a compressive load applied to the load cell 54a is increased by a certain amount which substantially coincides with the roll load (pressing load) applied to the substrate W by the lower roll cleaning member 48.

Accordingly, the roll load applied to the substrate W by the lower roll cleaning member 48 during cleaning of the substrate W is measured by the load cell 54a based on the increased compressive load and the valve opening degree is adjusted by an operation amount of the electropneumatic regulator (regulating device) 62a, thereby regulating the roll load.

The measured value measured by the load cell 54a is outputted to an indicator 64a, and an analog signal is sent from the indicator 64a to the controller 66. Then, the analog signal sent from the controller 66 is inputted to the electropneumatic regulator 62a. Thus, a closed-loop control system for performing a closed-loop control is constructed. Further, a preset value of the roll load (preset roll load) is inputted from the control panel (operation panel) 30 to the controller 66.

With this configuration, the controller 66 compares the measured value (measured roll load) measured by the load cell 54a and the preset roll load inputted from the control panel (operation panel) 30 and gives the electropneumatic regulator 62a an instruction of an operation amount of a regulating valve (valve-operation-amount) depending on a difference between the measured roll load and the preset roll load. The electropneumatic regulator 62a automatically adjusts the valve opening degree in response to the instruction from the controller 66 to vary a thrust force of the air cylinder 56a with the adjusted valve opening degree, thereby performing feedback control of the roll load applied to the substrate W during cleaning of the substrate W.

According to this example, the load cell 54a is provided between the vertically movable shaft 59 of the vertical movement mechanism 60a and the lower roll holder 44 coupled to the vertically movable shaft 59 and the load cell 54a is configured to receive the own weight of the lower roll holder 44. Further, a bearing or a link rod which increases friction during vertical movement of the lower roll holder 44, or a beam structure or a projection which causes a loss in load transmission, is not provided between the lower roll holder 44 and the load cell 54a. Thus, the roll load applied to the substrate W during cleaning of the substrate is transmitted to the load cell 54a accurately, thereby measuring the roll load with high accuracy and controlling the roll load.

If the load cell 54a breaks down during cleaning of the substrate W while measuring the roll load by the load cell 54a, the accurate roll load cannot be measured, and thus an appropriate roll load cannot be applied to the substrate W by the lower roll cleaning member 44.

Therefore, as described above, the monitor unit 80 connected to the controller 66 monitors whether the valve-operation-amount of the electropneumatic regulator 62a falls outside an allowable range of the reference value of the valve-operation-amount depending on the preset roll load, thereby detecting breakdown of the load cell 54a promptly during cleaning of the substrate W. When the monitor unit 80 detects the breakdown of the load cell 54*a*, an alarm is issued from the alarm 82.

In the substrate cleaning apparatus (scrub cleaning apparatus) having the above structure, as shown in FIG. 2, a peripheral portion of the substrate W is located in an engagement groove 90*a* formed in a circumferential surface of a spinning top 90 provided at an upper portion of each of the spindles 40. By spinning (rotating) the spinning tops 90 while pressing them inwardly against the peripheral portion of the substrate W, the substrate W is rotated horizontally in the direction shown by the arrow E in FIG. 2. In this embodiment, two of the four spinning tops 90 apply a rotational force to the substrate W, while the other two spinning tops 90 function as a bearing for supporting the rotation of the substrate W. It is also possible to couple all the spinning tops 90 to a drive mechanism so that they all apply a rotational force to the substrate W.

While horizontally rotating the substrate W and supplying a cleaning liquid (chemical liquid) from the upper cleaning liquid supply nozzle 50 to the front surface (upper surface) of the substrate W, the upper roll cleaning member 46 is rotated and lowered to be brought into contact with the front surface of the rotating substrate W under a predetermined roll load, thereby performing scrub cleaning of the front surface of the substrate W with the upper roll cleaning member 46 in the presence of the cleaning liquid. The length of the upper roll cleaning member 46 is set to be slightly larger than the diameter of the substrate W, and thus the entire length of the front surface of the substrate W in a diametrical direction, from one end to the other end of the substrate W can be cleaned at the same time.

When the front surface of the substrate W is scrub-cleaned with the upper roll cleaning member 46, the roll load applied to the substrate W by the upper roll cleaning member 46 is measured by the load cell 54. The controller 66 compares the measured value (measured roll load) and the preset roll load which has been inputted from the control panel 30, and gives an instruction of the operation amount of the regulating valve (valve-operation-amount) to the electropneumatic regulator 62 depending on a difference between the measured roll load and the preset roll load. The electropneumatic regulator 62 automatically adjusts the valve opening degree in response to the instruction from the controller 66 to vary a thrust force of the air cylinder 56 with the adjusted valve opening degree. Accordingly, the roll load applied to the substrate W during cleaning of the substrate W is feedback-controlled so that the roll load becomes equal to the preset roll load.

FIG. 6 is a flow chart showing an embodiment of the control for cleaning the front surface (upper surface) of the substrate W while performing feedback control of the roll load applied to the substrate W by the upper roll cleaning member 46 of the substrate cleaning apparatus shown in FIG. 3. An embodiment of the control for cleaning the back surface (lower surface) of the substrate W while performing feedback control of the roll load applied to the substrate W by the lower roll cleaning member 48 of the substrate cleaning apparatus shown in FIG. 3 is substantially the same as the above, and therefore the explanation will be omitted hereinafter.

As shown in FIG. 6, the reference values of the valve-operation-amount of the electropneumatic regulator 62 corresponding to the respective preset roll loads, e.g. values on the line A shown in FIG. 4 or FIG. 5, are inputted from the control panel 30, and these reference values of the valve-operation-amount (line A) are stored in the monitor unit 80 (step 1). Then, the roll load (preset roll load), which should be applied to the substrate W from the upper roll cleaning member 46 during cleaning, e.g. the preset roll load R (N) shown in FIG. 4 or FIG. 5 is inputted from the control panel 30 to the controller 66 (step 2).

Next, while horizontally rotating the substrate W and supplying a cleaning liquid (chemical liquid) from the upper cleaning liquid supply nozzle 50 to the front surface (upper surface) of the substrate W, the upper roll cleaning member 46 is rotated and lowered to be brought into contact with the front surface of the rotating substrate W, thereby performing scrub cleaning of the front surface of the substrate W with the upper roll cleaning member 46 in the presence of the cleaning liquid. The roll load applied to the substrate W during cleaning of the substrate W is feedback-controlled so that the roll load becomes equal to the preset roll load (step 3).

The monitor unit 80 compares the reference value of the valve-operation-amount, of the stored reference values of the valve-operation-amount, corresponding to the preset roll load, e.g. the reference value S of the valve-operation-amount at which the preset roll load R (N) intersects with the line A (the reference value of the valve-operation-amount) shown in FIG. 4 or FIG. 5, and the valve-operation-amount (current valve-operation-amount) which is outputted from the controller 66 to the electropneumatic regulator 62 (step 4). Then, the monitor unit 80 judges whether the current valve-operation-amount falls outside the allowable range of the reference value of the valve-operation-amount corresponding to the preset roll load. For example, the monitor unit 80 judges whether the valve-operation-amount falls outside the range (T1 to T2) shown in FIG. 4 between the lower threshold T1 (kPa) as an intersection at which the preset roll load R intersects with the line B, and the upper threshold T2 (kPa) as an intersection at which the preset roll load R intersects with the line C, or the range (T3 to T4) shown in FIG. 5 between the lower threshold T3 (kPa) as an intersection at which the preset roll load R intersects with the line D, and the upper threshold T4 (kPa) as an intersection at which the preset roll load R intersects with the line E (step5).

When the current valve-operation-amount falls outside the allowable range of the reference value of the valve-operation-amount corresponding to the preset roll load, e.g. the current valve-operation-amount becomes smaller than the lower threshold T1 (kPa) shown in FIG. 4 or the lower threshold T3 (kPa) shown in FIG. 5, or the current valve-operation-amount becomes larger than the upper threshold T2 (kPa) shown in FIG. 4 or the upper threshold T4 (kPa) shown in FIG. 5, the monitor unit 80 judges breakdown of the load cell 54 and issues an alarm from the alarm 82 (step 6). Then, the cleaning process is forcibly terminated and the apparatus running is stopped after retrieving the substrates inside the apparatus (step 7).

On the other hand, when the current valve-operation-amount does not fall outside the allowable range of the reference value of the valve-operation-amount corresponding to the preset roll load, the monitor unit 80 judges whether a predetermined cleaning time has elapsed (step 8). If the predetermined cleaning time has not elapsed, the processing is returned to step 4. If the predetermined cleaning time has elapsed, the cleaning is terminated (step 9). Then, a process of a subsequent substrate is started (step 10), and the processing is returned to step 2.

In this manner, the breakdown of the load cell 54 can be detected promptly during cleaning of the substrate W, and the cleaning of the substrate in a state in which an abnormal roll load is applied to the substrate W by the roll cleaning member 46 can be prevented from being continued.

Simultaneously, while supplying a cleaning liquid (chemical liquid) from the lower cleaning liquid supply nozzle 52 to the back surface (lower surface) of the substrate W, the lower roll cleaning member 48 is rotated and raised to be brought into contact with the back surface of the rotating substrate W under a predetermined roll load, thereby performing scrub cleaning of the back surface of the substrate W with the lower roll cleaning member 48 in the presence of the cleaning liquid. The length of the lower roll cleaning member 48 is set to be slightly larger than the diameter of the substrate W, and thus the entire back surface of the substrate W is cleaned, as with the above-described cleaning of the front surface of the substrate W.

During scrub cleaning of the back surface of the substrate W with the lower roll cleaning member 48, the roll load applied to the substrate W during cleaning of the substrate W is feedback-controlled so that the roll load becomes equal to the preset roll load, as with the case of the above-described upper roll cleaning member 46.

In the substrate processing apparatus shown in FIG. 1, the substrate taken out from a substrate cassette inside the loading port 12 is transferred to one of the polishing units 14a, 14b, 14c, 14d, and the surface of the substrate is polished by the specified polishing unit. The surface of the substrate which has been polished is cleaned (primarily cleaned) in the first substrate cleaning unit 16, and is then cleaned (finally cleaned) in the second substrate cleaning unit 18. Then, the cleaned substrate is removed from the second substrate cleaning unit 18 and transferred to the substrate drying unit 20 where the substrate is spin-dried. Thereafter, the dried substrate is returned into the substrate cassette inside the loading port 12.

In the above examples, although both of the roll load applied to the front surface (upper surface) of the substrate by the upper roll cleaning member 46 and the roll load applied to the back surface (lower surface) of the substrate by the lower roll cleaning member 48 are feedback-controlled using a closed-loop control system, either one of them may be feedback-controlled depending on use conditions (process, property of the substrate, pressing load, and the like).

Although preferred embodiments have been described in detail above, it should be understood that the present invention is not limited to the illustrated embodiments, but many changes and modifications can be made therein without departing from the appended claims.

What is claimed is:

1. A substrate cleaning apparatus for cleaning a substrate, comprising:
   a roll holder configured to support a roll cleaning member and rotate said roll cleaning member;
   a movement mechanism having an actuator and a regulating device configured to regulate output of the actuator, said movement mechanism being configured to move said roll holder so that said roll cleaning member applies a roll load to the substrate at the time of cleaning the substrate by actuation of said actuator;
   a load cell configured to measure said roll load;
   a controller configured to perform feedback control of said roll load through said regulating device based on the measured value of said load cell, wherein said feedback control is performed so that said controller outputs an operation amount to said regulating device depending on a difference between the measured value of said load cell and a preset roll load; and
   a monitor unit configured to monitor whether said operation amount outputted to said regulating device falls outside a preset allowable range of operation amount and configured to detect said operation amount falling outside said preset allowable range, wherein said monitor unit outputs a signal when said operation amount outputted to said regulating device falls outside said preset allowable range of operation amount.

2. A substrate cleaning apparatus according to claim 1, wherein said actuator comprises an air cylinder, and said regulating device comprises an electropneumatic regulator configured to control a valve opening degree of a regulating valve for regulating a pressure of air to be supplied to said air cylinder.

3. A substrate cleaning apparatus according to claim 1, wherein said monitor unit outputs said signal to an alarm when said operation amount outputted to said regulating device falls outside said preset allowable range of operation amount, and said alarm issues an alarm in response to said signal.

4. A substrate cleaning apparatus according to claim 1, wherein said roll cleaning member is elongated horizontally.

5. A substrate cleaning apparatus according to claim 1, wherein said movement mechanism is configured to move said roll holder vertically.

6. A substrate cleaning apparatus according to claim 1, wherein said preset allowable range of operation amount is determined based on said preset roll load.

* * * * *